(12) United States Patent
Maishev et al.

(10) Patent No.: US 6,214,183 B1
(45) Date of Patent: Apr. 10, 2001

(54) COMBINED ION-SOURCE AND TARGET-SPUTTERING MAGNETRON AND A METHOD FOR SPUTTERING CONDUCTIVE AND NONCONDUCTIVE MATERIALS

(75) Inventors: Yuri Maishev, Moscow (RU); James Ritter, Fremont, CA (US); Leonid Velikov; Alexander Shkolnik, both of San Carlos, CA (US)

(73) Assignee: Advanced Ion Technology, Inc.

( * ) Notice: Subject to any disclaimer, the term of this patent is extended or adjusted under 35 U.S.C. 154(b) by 0 days.

(21) Appl. No.: 09/240,468

(22) Filed: Jan. 30, 1999

(51) Int. Cl.[7] .................................................. C23C 14/34
(52) U.S. Cl. .............................. 204/298.04; 204/298.16; 204/298.19
(58) Field of Search .......................... 204/192.12, 192.11, 204/298.04, 298.16, 298.17, 298.18, 298.19, 298.2, 298.21, 298.22, 298.08

(56) References Cited

U.S. PATENT DOCUMENTS

| | | |
|---|---|---|
| 4,122,347 | 10/1978 | Kovalsky et al. . |
| 4,684,848 | 8/1987 | Kaufman . |
| 4,710,283 | 12/1987 | Singh et al. . |
| 4,885,070 * | 12/1989 | Campbell et al. ............... 204/298.04 |
| 5,454,919 * | 10/1995 | Hill et al. ......................... 204/298.04 |
| 5,525,199 * | 6/1996 | Scobey ............................ 204/192.12 |
| 5,618,389 | 4/1997 | Kreider . |
| 5,962,080 * | 10/1999 | Tan et al. ........................ 204/192.11 |

FOREIGN PATENT DOCUMENTS

| | | | |
|---|---|---|---|
| 4-099173 * | 3/1992 | (JP) ................................. | 204/298.04 |
| 2030807 | 3/1995 | (RU) . | |

* cited by examiner

Primary Examiner—Nam Nguyen
Assistant Examiner—Gregg Cantelmo
(74) Attorney, Agent, or Firm—Ilya Zborosky

(57) ABSTRACT

A combined ion-source and sputtering magnetron apparatus of the invention comprises a vacuum working chamber that contains a sputtering magnetron, an object to be treated fixed inside the housing of the chamber, and an ion-beam source installed within the working chamber between the object and the sputtering magnetron. In a preferred embodiment, the ion source is a cold-cathode ion source with a closed loop ion-emitting slit and drift of electrons in crossed electric and magnetic fields. The ion source emits the ion beam in the radial inward or outward direction onto the surface of the magnetron target at an oblique angle to the target surface. The bombardment of the target surface with the ion beam generates a large amount of sputtered particles. In addition, the ion bombardment forms a large amount of secondary electrons which are accelerated in the direction away from the target and are held in the crossed electric and magnetic fields of the magnetron target. These electrons ionize molecules of a working gas and forms a plasma. Ions are extracted from the plasma towards the target and sputter its material. This process is maintained in a steady mode. The apparatus is shown in various embodiments including a conveyor treatment.

18 Claims, 10 Drawing Sheets

COMBINED ION-SOURCE AND TARGET-SPUTTERING MAGNETRON AND A METHOD FOR SPUTTERING CONDUCTIVE AND NONCONDUCTIVE MATERIALS

FIELD OF THE INVENTION

The present invention relates to the field of ion-emission technique, particularly to an apparatus which combines in itself an ion-beam and magnetron-plasma source intended for cleaning, activation, polishing, etching, or thin-film coating of surfaces. The invention also relates to a method for sputtering conductive and nonconductive materials with the use of the aforementioned apparatus.

BACKGROUND OF THE INVENTION AND DESCRIPTION OF THE PRIOR ART

An ion source is a device that ionizes gas molecules and then, accelerates, focuses, and emits them as an ion beam. This beam is then used for various technical and technological purposes such as cleaning, activation, polishing, thin-film coating, or etching.

An example of an ion source is the so-called Kaufman ion source, also known as a Kaufman ion engine or an electron-bombardment ion source described in U.S. Pat. No. 4,684, 848 issued to H. R. Kaufman in 1987.

This ion source consists of a discharge chamber, in which a plasma is formed, and an ion-optical system which generates and accelerates an ion beam to an appropriate level of energy. A working medium is supplied to the discharge chamber which contains a hot cathode that functions as a source of electrons and is used for firing and maintaining a gas discharge. The plasma, which is formed in the discharge chamber, acts as an emitter of ions and creates, in the vicinity of the ion-optical system, an ion-emitting surface. As a result, the ion-optical system extracts ions from the aforementioned ion-emitting surface, accelerates them to a required energy level, and forms an ion beam of a required configuration. Typically, aforementioned ion sources utilize two-grid or three-grid ion-optical systems.

A disadvantage of such a device is that it requires the use of ion accelerating grids and an ion beam of low intensity. Another disadvantage is that this apparatus is not suitable for operation with reactive gases.

Attempts have been made to provide ion sources with ion beams of higher intensity by holding the electrons in a closed space between a cathode and an anode where the electrons could be held. For example, U.S. Pat. No. 4,122, 347 issued in 1978 to Kovalsky et al. describes an ion source with a closed-loop trajectory of electrons for ion-beam etching and deposition of thin films, wherein the ions are taken from the boundaries of a plasma formed in a gas-discharge chamber with a hot cathode. The ion beam is intensified by a flow of electrons which are held in crossed electrical and magnetic fields within the accelerating space and which compensate for the positive spatial charge of the ion beam.

A disadvantage of devices of such type is that they do not allow formation of ion beams of chemically-active substances because of the use of a hot cathode and because of strong localization of the plasma-formation zone. Other disadvantages of the aforementioned devices are short service life and high non-uniformity of ion beams.

U.S. Pat. No. 4,710,283 issued in 1997 to Singh et al. describes a coldcathode type ion source with crossed electric and magnetic fields for ionization of a working substance wherein entrapment of electrons and generation of the ion beam are performed with the use of a grid-like electrode. This source is advantageous in that it forms belt-like and tubular ion beams emitted in one or two opposite directions.

However, the ion source with a grid-like electrode of the type disclosed in U.S. Pat. No. 4,710,283 has a number of disadvantages consisting in that the grid-like electrode makes it difficult to produce an extended ion beam and in that the ion beam is additionally contaminated as a result of sputtering of the material from the surface of the grid-like electrode. Furthermore, with the lapse of time the grid-like electrode is deformed whereby the service life of the ion source as a whole is shortened.

Other publications (e.g., Kaufman H. R. et al. (End Hall Ion Source, J. Vac. Sci. Technol., Vol. 5, Jul/Aug., 1987, pp. 2081–2084; Wykoff C.A. et al., 50-cm Linear Gridless Source, Eighth International Vacuum Web Coating Conference, Nov. 6–8, 1994)) disclose an ion source that forms conical or belt-like ion beams in crossed electrical and magnetic fields. The device consists of a cathode, a hollow anode with a conical opening, a system for the supply of a working gas, a magnetic system, a source of electric supply, and a source of electrons with a hot cathode. A disadvantage of this device is that it requires the use of a source of electrons with a hot or hollow cathode and that it has electrons of low energy level in the zone of ionization of the working substance. These features create limitations for using chemically-active working substances. Furthermore, a ratio of the a cathodeanode distance to the Larmor radius is significantly greater than 1, and this decreases the energy of electrons in the charge gap, and hence, hinders ionization of the working substance. Configuration of the electrodes used in the ion beam of such sources leads to a significant divergence of the ion beam and degradation of the cathode material because of sputtering. As a result, the ion beam cannot be delivered to a distant object and is to a greater degree subject to contamination with the material of the electrode. In other words, the device described in the aforementioned literature is extremely limited in its capacity to create an extended uniform belt-like ion beam. Another disadvantage for target sputtering is a low energy of ions which does not allow effective sputtering of nonconductive, e.g., dielectric materials.

Russian Patent No. 2,030,807 issued in 1995 to M. Parfenyonok, et al. describes an ion source that comprises a magnetoconductive housing used as a cathode having an ion-emitting slit, an anode arranged in the housing symmetrically with respect to the emitting slit, a magnetomotance source, a working gas supply system, and a source of electric power supply.

FIGS. 1 and 2 schematically illustrate the aforementioned known ion source with a circular ion-beam emitting slit. More specifically, FIG. 1 is a sectional side view of an ion-beam source with a circular ion-beam emitting slit, and FIG. 2 is a sectional plan view along line II—II of FIG. 1.

The ion source of FIGS. 1 and 2 has a hollow cylindrical housing 40 made of a magnetoconductive material such as Armco steel (a type of a mild steel), which is used as a cathode. Cathode 40 has a cylindrical side wall 42, a closed flat bottom 44 and a flat top side 46 with a circular ion emitting slit 52.

A working gas supply hole 53 is formed in flat bottom 44. Flat top side 46 functions as an accelerating electrode. Placed inside the interior of hollow cylindrical housing 40 between bottom 44 and top side 46 is a magnetic system in the form of a cylindrical permanent magnet 66 with poles N and S of opposite polarity. An N-pole faces flat top side 46 and S-pole faces bottom side 44 of the ion source. The purpose of a magnetic system 66 with a closed magnetic circuit formed by parts 66, 40, 42, and 44 is to induce a magnetic field in ion emitting slit 52. It is understood that this magnetic system is shown only as an example and that it can be formed in a manner described, e.g., in aforementioned U.S. Pat. No. 4,122,347. A circular annular-shaped anode 54 which is connected to a positive pole 56a of an electric power source 56 is arranged in the interior of housing 40 around magnet 66 and concentric thereto. Anode 54 is fixed inside housing 40 by means of a ring 48 made of a non-magnetic dielectric material such as ceramic. Anode 54 has a central opening 55 in which aforementioned permanent magnet 66 is installed with a gap between the outer surface of the magnet and the inner wall of opening 55. A negative pole 56b of electric power source is connected to housing 40 which is grounded at GR.

Located above housing 40 of the ion source of FIGS. 1 and 2 is a sealed vacuum chamber 57 which has an evacuation port 59 connected to a source of vacuum (not shown). An object OB to be treated is supported within chamber 57 above ion emitting slit 52, e.g., by gluing it to an insulator block 61 rigidly attached to the housing of vacuum chamber 57 by a bolt 63 but so that object OB remains electrically and magnetically isolated from the housing of vacuum chamber 57. However, object OB is electrically connected via a line 56c to negative pole 56b of power source 56. Since the interior of housing 40 communicates with the interior of vacuum chamber 57, all lines that electrically connect power source 56 with anode 54 and object OB should pass into the interior of housing 40 and vacuum chamber 57 via conventional commercially-produced electrical feedthrough devices which allow electrical connections with parts and mechanisms of sealed chambers without violation of their sealing conditions. In FIG. 1, these feedthrough devices are shown schematically and designated by reference numerals 40a and 57a. Reference numeral 57b designates a seal for sealing connection of vacuum chamber 57 to housing 40.

The known ion source of the type shown in FIGS. 1 and 2 is intended for the formation of a unilaterally directed tubular ion beam. The source of FIGS. 1 and 2 forms a tubular ion beam IB emitted in the direction of arrow A and operates as follows.

Vacuum chamber 57 is evacuated, and a working gas is fed into the interior of housing 40 of the ion source. A magnetic field is generated by magnet 66 in the accelerating gap between anode 54 and cathode 40, whereby electrons begin to drift in a closed path within the crossed electrical and magnetic fields. A plasma 58 is formed between anode 54 and cathode 40. When the working gas is passed through the ionization gap, tubular ion beam EB, which is propagated in the axial direction of the ion source shown by an arrow A, is formed in the area of an ion-emitting slit 52 and in an accelerating gap 52a between anode 54 and cathode 40.

The above description of the electron drift is simplified to ease understanding of the principle of the invention. In reality, the phenomenon of generation of ions in the ion source with a closed-loop drift of electrons in crossed electric and magnetic fields is of a more complicated nature and consists in the following.

When, at starting the ion source, a voltage between anode 54 and cathode 40 reaches a predetermined level, a gas discharge occurs in anode-cathode gap 52a. As a result, the electrons, which have been generated as a result of ionization, begin to migrate towards anode 54 under the effect of collisions and oscillations. After being accelerated by the electric field, the ions pass through ion-emitting slit 52 and are emitted from the ion source. Inside the ion-emitting slit, the crossed electric and magnetic fields force the electrons to move along closed cycloid trajectories. This phenomenon is known as "magnetization" of electrons. The magnetized electrons remain drifting in a closed space between two parts of the cathode, i.e., between those facing parts of cathode 40 which form ion-emitting slit 52. The radius of the cycloids is, in fact, the so-called doubled Larmor radius & which is represented by the following formula:

$$R_L = mcV/|e|B,$$

where m is a mass of the electron, B is the strength of the magnetic field inside the slit, V is a velocity of the electrons in the direction perpendicular to the direction of the magnetic field, and $|e|$ is the charge of the electron.

It is required that the height of the electron drifting space in the ion-emission direction be much greater than the aforementioned Larmor radius. This means that, in distinction from the aforementioned Hall-end Kaufman ion source, where a ratio of cathode-anode distance to the Larmor radius is equal approximately to 1. In other words, a part of the ionization area penetrates into ion-emitting slit 52 where electrons can be maintained in a drifting state over a long period of time. In other words, a spatial charge of high density is formed in ion-emitting slit 52.

When a working medium, such as argon which has neutral molecules, is injected into the slit, the molecules are ionized by the electrons present in this slit and are accelerated by the electric field. As a result, the thus formed ions are emitted from the slit towards the object. Since the spatial charge has high density, an ion beam of high density is formed. This beam can be converged or diverged by known technique for specific applications.

Thus, the electrons do not drift in a plane, but rather along cycloid trajectories across ion-emitting slit 52. However, for the sake of convenience of description, here and hereinafter such expression as "electron drifting plane" or "drifting in the direction of ion-beam propagation" will be used.

The diameter of the tubular ion beam formed by means of such an ion source may reach 500 mm and more.

The ion source of the type shown in FIG. 1 is not limited to a cylindrical configuration and may have an elliptical or an oval-shaped cross section as shown in FIG. 3. FIG. 3 is a cross-sectional view of the ion-beam source along line III—III of FIG. 1. In FIG. 3 the parts of the ion beam source that correspond to similar parts of the previous embodiment are designated by the same reference numerals with an addition of subscript OV. Structurally, this ion source is the same as the one shown in FIG. 1 with the exception that a cathode $40_{ov}$, anode $54_{ov}$, a magnet $66_{ov}$, and hence an emitting slit (not shown in FIG. 3), have an oval-shaped configuration. As a result, a belt-like ion beam having a width of up to 1400 mm can be formed. Such an ion beam source is suitable for treating large-surface objects when these objects are passed over ion beam IB emitted through emitting slit 52.

With 1 to 3 kV voltage on the anode and various working gases, this source makes it possible to obtain ion beams with currents of 0.5 to 1A. In this case, an average ion energy is within 400 to 1500 eV, and nonuniformity of treatment over the entire width of a 1400 mm-wide object does not exceed ±2%.

Nevertheless, the aforementioned belt-type ion source is disadvantageous in that for use in sputtering, this ion source also requires the use of spatially located targets of sputterable material. This increases the overall dimensions of a sputtering system. A sputtering system of such type is disclosed in pending U.S. patent application Ser. No. 09/161,581 of the same applicants filed in Sep. 28, 1998 now U.S. Pat. No. 6,130,507 issued Oct. 10, 2000.

The above problems are partially solved by a device which in the sputtering technology is known as a magnetron plasma source. Such a device is described, e.g., by J. Reece Roth in "Industrial Plasma Engineering", Institute of Physics Publishing, Bristol and Philadelphia, 1995, p. 337. Basically, a magnetron plasma source, which hereinafter will be referred to as "sputtering magnetron", incorporates a crosswise magnetic field over the cathode, which traps the beam electrons in orbits in that location and thus greatly increases their path length before they finally escape to the anode by collisional scattering. Because the electron's travel path becomes longer than the electron gap, the minimum pressure to sustain the plasma is much lower for the sputtering magnetron than, e.g., for a planar diode—typically 0.1 Pa instead of 3 Pa. At 0.1 Pa, the sputtered particles retain most of their kinetic energy upon reaching the substrate, so the one obtains the beneficial effects of this energy. A planar diode is a plasma source device which consists of two parallel electrodes, namely cathode and anode, where the cathode is grounded and the anode is under a high positive potential with respect to the ground. If a plasma is generated in a cathode-anode space and an object is placed into this plasma, the material of the cathode will be deposited on the object.

A typical sputtering magnetron construction is shown in FIG. 4 which is a sectional three-dimensional view of a planar-magnetron structure. In this drawing, for clarity, the electron-orbit radius is shown much larger than the actual size.

The device consists of a vacuum chamber 100 the walls of which function as an anode. The bottom of the chamber is formed by a watercooled copper backing plate 102 which supports a target 104 of a sputterable material in the form of a 3 to 10 mm thick disk which is bonded for good thermal contact to backing plate 102. Bonding can be done by soldering, or through an epoxy resin, but preferably through clamping in order to provide possibility for replacing sputterable target 104 after its consumption. Vacuum chamber 100 is sealed by an insulating ring 105, e.g., of ceramic, placed between the lower end of vacuum chamber 100 and the flange of the copper backing plate 102. The vacuum chamber wall or an anode assembly is grounded at G. The cathode assembly is formed by copper backing plate 102, a ring of bar magnets 106 and one central magnet 108 inserted into the respective recesses 110 and 112 of backing plate 102, and a Fe field return plate 114 for completion of the magnetic field. The cathode is under a high negative potential, e.g., of about −400 to −800 V. Using the strongest magnets (Nd—Fe—B), the field over the target can approach 1 KGa, or 0.1 T in SI units.

Upon igniting the plasma, flow of electrons emitted from the cathode become accelerated into the plasma by the cathode-sheath electric field E, just as in the case of a planar diode. The presence of the magnetic field B, however, causes them also curve into orbits, and the plasma electrons are magnetized, as was described earlier. The ions, however, are not magnetized. The sputtering magnetron will still operate as a sputtering source at much higher pressure, but gas scattering will dominate electron behavior rather than B.

At low pressure, the sputtering magnetron operates as follows: electrons emitted from the sputterable target surface or created by ionization in the sheath field are accelerated vertically by E but, at the same time, forced sidewise by B, so they eventually reverse direction and return toward sputterable target 104, decelerating in E as they proceed until their direction is again reversed and the cycle repeat. As has by described earlier, the electrons would follow a "cycloidal" path. In reality, the path is more complicated because of collision and because E decreases with distance from sputterable target 104.

Also, deposition rate is increased in the sputtering magnetron because of reduced scattering and redeposition of sputtered particles on the cathode. Finally, the increased efficiency of electron usage means that lower applied voltage (typically 500 V) is needed to sustain a plasma of a given density, and that the voltage increases even less steeply with power than it does in the planar diode.

Magnetrons can be energized by direct-current or high-frequency (RF) power sources. A main disadvantage of a sputtering magnetrons of both type is high pressure of the working medium, high ignition voltage of discharge, high discharge-sustaining power a significant part of which is converted into the Joule heat on the target and which require intensive cooling. Although the RF magnetrons are capable of sputtering nonconductive materials such as dielectric, direct-current magnetrons cannot sputter nonconductive materials. Furthermore, in a magnetron the pressure of the working medium is permanent inside the entire vacuum chamber, i.e., near the sputterable target and near the object (substrate) being treated. The magnitude of this pressure is selected so as to ensure the maximum efficiency of the working gas ionization. This pressure, however, is not always optimum for treating the substrate surface. In other words, the optimum pressure required for surface treatment and the pressure required for optimization of the working gas ionization are contradictory. Another disadvantage of the sputtering magnetron is that the erosion pattern of sputtering magnetron target is highly nonuniform across the target surface. A serious disadvantage of a magnetron is that a dielectric film is often formed on the sputtering surface of target in the case of a reactive sputtering. This film decreases the sputtering surface and is subject to electric breakdown with erruption of particles of target having dimensions much greater than the sputtered ions. This contaminates the object being treated.

It is known to combine an ion beam source with a sputtering magnetron in a vacuum chamber for enhancing sputtering. Such a device is described in U.S. Pat. No. 5,618,389 issued in 1996 to K. Kreider. The device is used for producing transparent carbon nitride films. The films are made by using a magnetron sputter gun and an ion beam source in a vacuum chamber. A disadvantage of this device is that it employs two separate and complicated units, i.e., an ion beam source and a sputtering magnetron. This makes the device expensive and with large overall dimensions. The application is limited because the direction of sputtering by the magnetron and by the ion source are different, i.e., the emission occurs under different angles to the surface of the object. However, the geometry of an object being treated not always allows for utilization of two separate processing units, i.e., the ion beam source and the sputtering magnetron emits ion beams or sputter particles under different angles with respect to the surface of the object. Each of these units requires the use of separate power supply sources, gas delivery systems, etc. Optimum modes of operation (gas pressure, gas flows, etc.) are not always compatible for the use of the sputtering magnetron and the ion source simultaneously in a common vacuum chamber. Furthermore, the apparatus of the aforementioned patent does not provide formation of coating films of uniform thickness and properties.

The problems of the apparatus of U.S. Pat. No. 5,618,389 are partially solved by an apparatus disclosed in U.S. Pat. No. 6,153,067 issued Nov. 28, 2000. now U.S. Pat. No. 6,153,067. This apparatus combines a cold-cathode ion source with a closed-loop ion-emitting slit and a target-sputtering direct-current magnetron in which the direction of propagation of the ion beam coincides with the direction of the flow of sputtered particles. In this apparatus, the sputterable target is placed either onto the entire cathode or onto a part thereof which is charged negatively with respect to another part which is grounded. During the operation of the apparatus, the ion beam emitted from the ion source acts as a virtual anode with respect to the magnetron target. More specifically, in operation of this apparatus, a negative potential of about −500V is applied from a power supply source to a cathode assembly and thus to a sputterable target, while a positive voltage of about 1000V to 1500V is applied to the anode, and a magnetic field B of about 1000 to 3000 Ga is generated across the ion-emitting slit. The potential difference of 500 to 1500 V between the anode and the cathode assembly causes a discharge in the anodecathode space. When working gas passes via the anode-cathode space, a discharge occurs with the formation of the plasma. The molecules of the gas are ionized. The ions are accelerated by the electric field E, and an ion beam IB is formed, which has a charge positive with respect to the sputterable target. The ion beam IB itself has a positive potential with respect to the object being treated, i.e., with respect to the ground, since the object is grounded. This positive potential is about several hundred volts. On the other hand, the cathode assembly and the sputterable target are under a negative voltage of about −500V. Thus the cathode/taget and the ion beam function as a sputtering magnetron where the positive ion beam functions as a virtual anode, transparent to electrons and thus being for them a "potential well". Ions formed in the magnetron discharge are accelerated toward the sputterable target, bombard the target, thus sputter its material, and knock-out secondary electrons from the target. These secondary electrons are accelerated by the negative potential of the target, are held in the crossed electric and magnetic fields of the target, and ionize molecules of the working medium. During operation of the magnetron, this process occurs constantly. The sputtered particles of the target are deposited onto the object forming a coating film. The magnetron-sputtering mode described above occurs simultaneously with the operation of the same apparatus as a pure ion source which enhances the treatment. This is because the combined ion-beam emission and magnetron sputtering significantly increases the life of high-velocity electrons and thus improves efficiency of ionization of the working medium. As a result, it becomes possible to reduce the working pressure in the magnetron sputtering discharge, decrease the discharge voltage, and improve quality of the film being deposited. The quality is improved because the residual gas is to a lower degree contaminates the coating film.

Nevertheless, the apparatus of aforementioned U.S. Pat. No. 6,153,067 has a number of disadvantages. A main disadvantage is that the sputterable target should have a special geometry which is determined by the shape of the cathode and may consist of two parts to cover the inner and outer parts of the upper plate of the cathode. Another problem is associated with cooling, since at high discharge power, the target and cathode require simultaneous intensive cooling.

OBJECTS OF THE INVENTION

It is an object of the invention to provide a combined ion-source and sputtering magnetron apparatus which is highly efficient in operation, simple in construction, allows sputtering of both conductive and nonconductive materials, provides activation, etching, cleaning or similar preparatory treatment of an object prior to and during overcoating, makes it possible to reduce pressure in the working chamber, generates high vacuum in the working chamber, operates in conjunction with both DC and RF magnetrons, makes it possible to decrease a magnetron discharge voltage and the discharge ignition voltage. Another object of the invention is to provide a method for sputtering conductive and nonconductive materials with the use of a combined ion-beam source and sputtering magnetron apparatus. Still another object is to provide removal of dielectric films from the surface of the magnetron target.

SUMMARY OF THE INVENTION

A combined ion-beam source and sputtering magnetron apparatus of the invention comprises a vacuum working chamber that contains a sputtering magnetron, a grounded object to be treated fixed inside the housing of the chamber, and an ion-beam source installed within the working chamber between the object and the sputtering magnetron. In a preferred embodiment, the ion source is a cold-cathode ion source with a closed loop ion-emitting slit and drift of electrons in crossed electric and magnetic fields. The ion source emits the ion beam in the radial inward or outward direction onto the surface of the magnetron target at an oblique angle to the target surface. This provides a coefficient of magnetron sputtering much higher than in the case of a normal or perpendicular direction of the beam to the surface of the target, whereby the magnetron operates with a very high efficiency. The bombardment of the target surface with the ion beam generates a large amount of sputtered particles. In addition, the ion bombardment forms a large amount of secondary electrons which are accelerated in the direction away from the target and are held in the crossed electric and magnetic fields of the magnetron target. These electrons ionize molecules of a working gas and forms a plasma. Ions are extracted from the plasma towards the target and sputter its material. This process is maintained in a steady mode. In another embodiment, the apparatus is provided with a second ion source of the type similar to the first one. The second ion source is used for pretreating the surface of the object, e.g., by activating or etching the surface of the object prior to the overcoating, or for ion-assistant growing of the film during the main treatment.

DETAILED DESCRIPTION OF THE INVENTION

Figure 1:
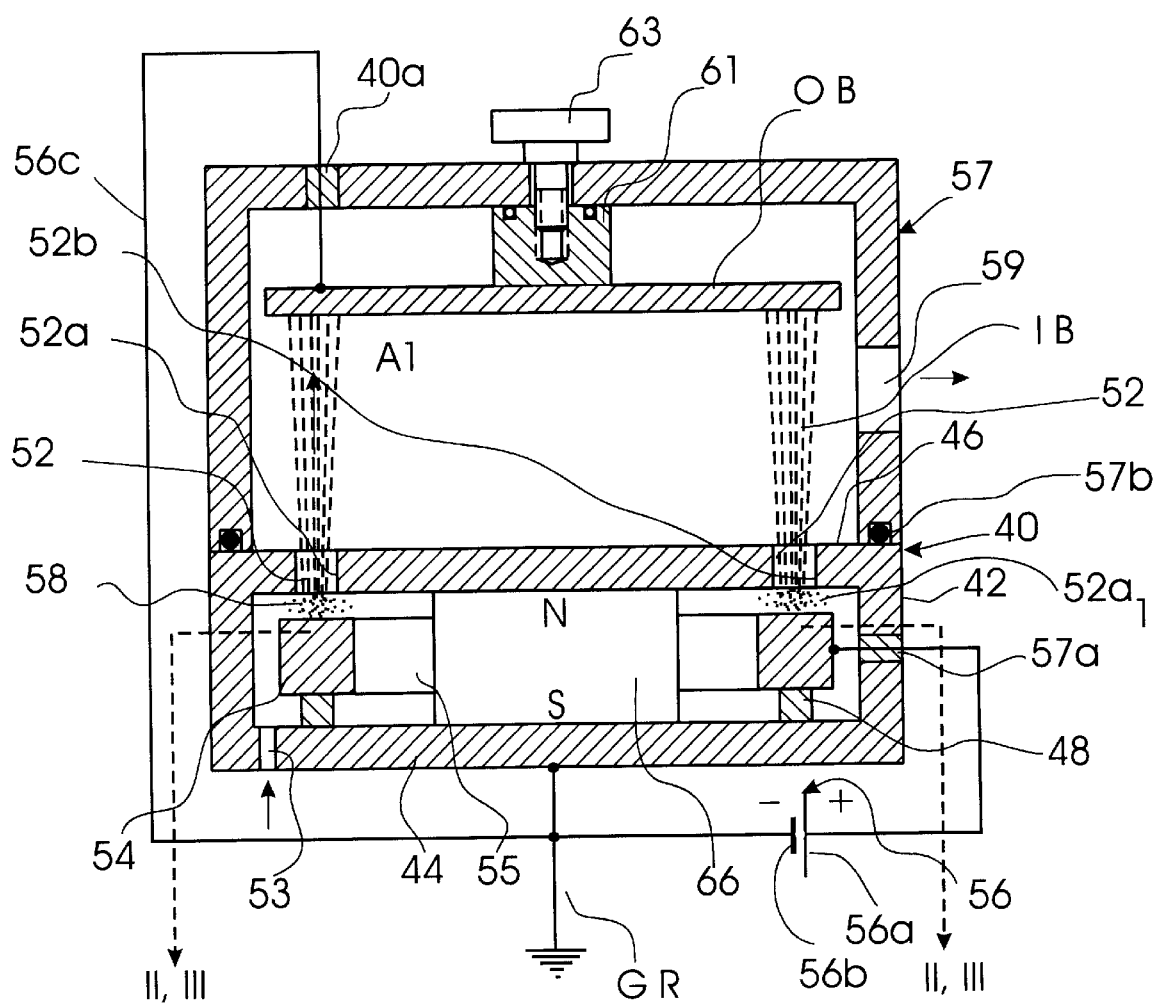
FIG. 1 is a sectional side view of a known ion-beam source with a circular ion-beam emitting slit.
Figure 2:
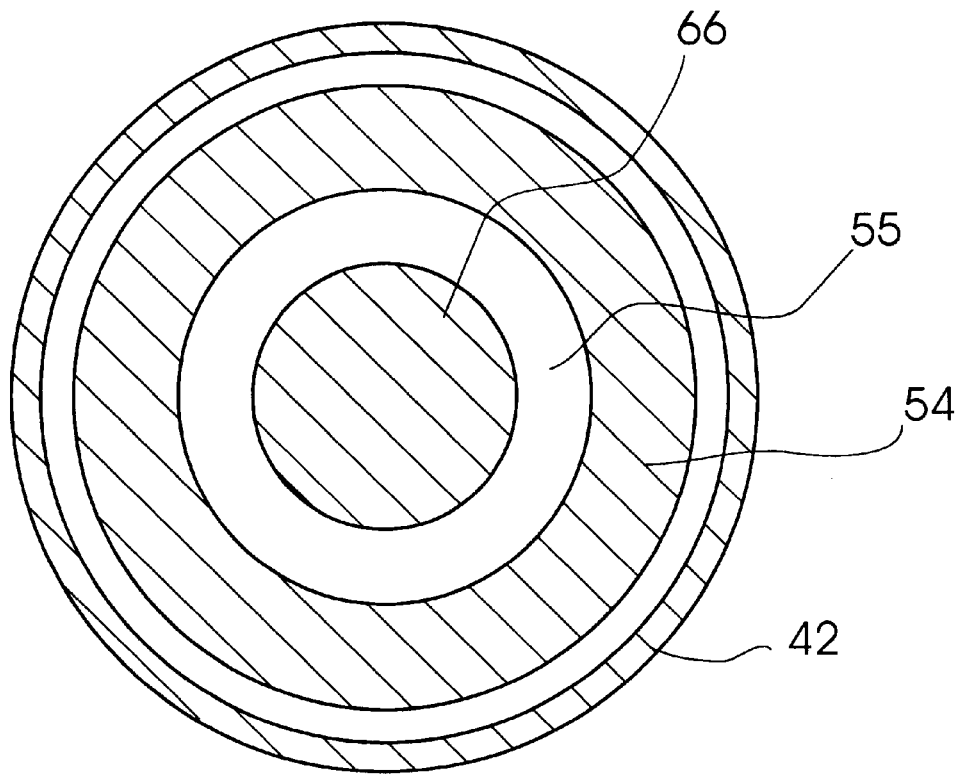
FIG. 2 is a sectional plan view along line II—II of FIG. 1.
Figure 3:
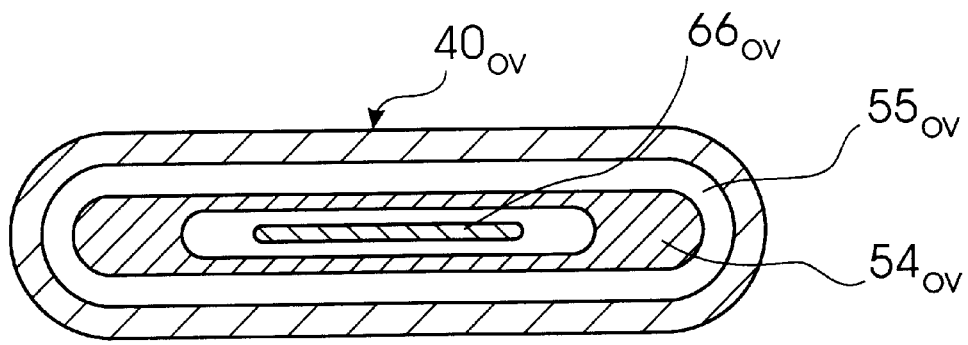
FIG. 3 is a crossectional view of the ion-beam source along line III—III of FIG. 1.
Figure 4:
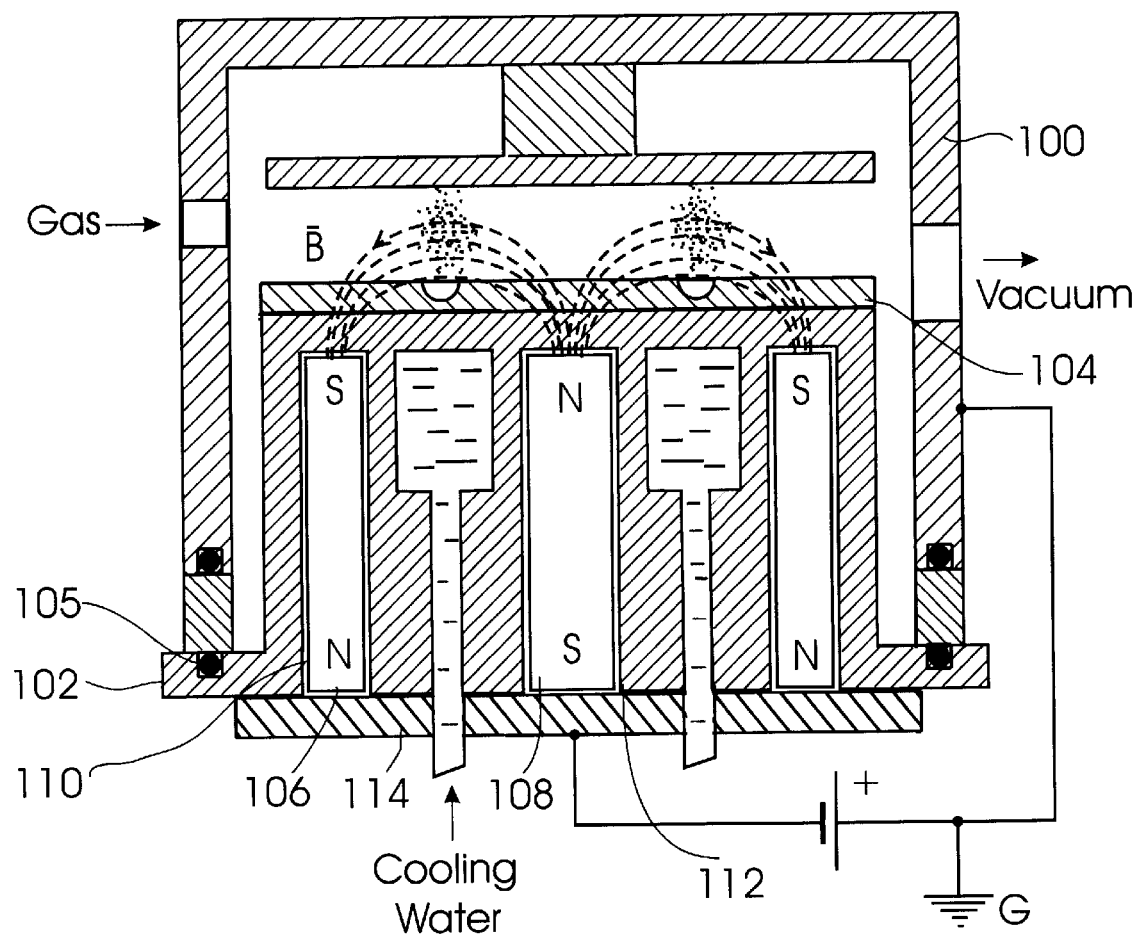
FIG. 4 is a schematic sectional view of a conventional magnetron.
Figure 5:
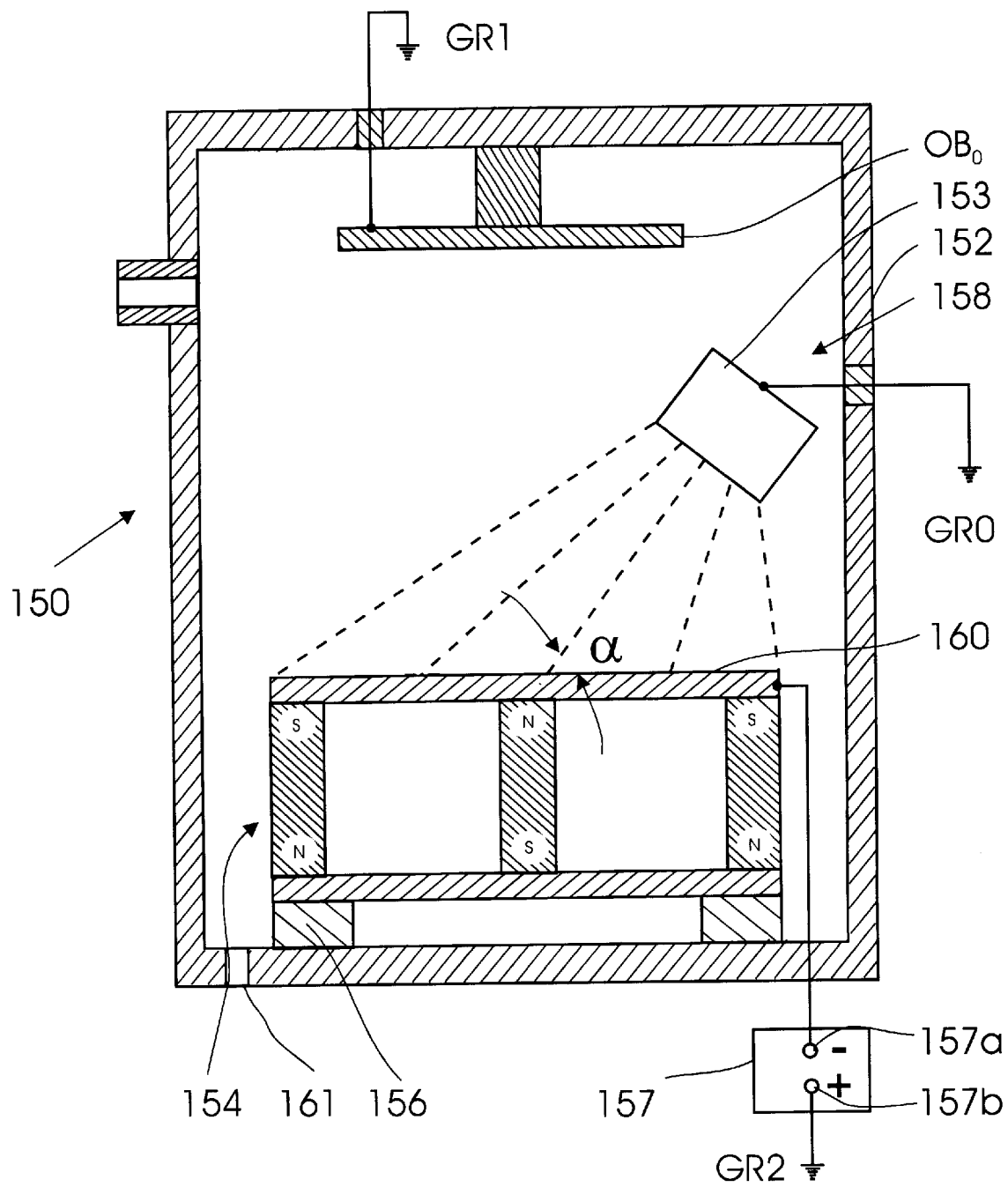
FIG. 5 is a schematic sectional view of a combined ion-beam source and sputtering magnetron apparatus in accordance with the invention where the ion beam has an oblique angle of incidence to the magnetron surface.

FIG. 5 is a general schematic sectional view of a combined ion-beam source and sputtering magnetron apparatus 150 in accordance with the invention. Apparatus 150 consists of a sealed housing 152 which contains a target-sputtering magnetron 154 supported in housing 152, e.g., by a block 156 of a nonconductive material, such as ceramic, and an ion-beam source 158 installed in housing 152 so that an ion beam $IB_0$ emitted from ion source 158 is directed onto a sputterable target 160 of magnetron 154 at an oblique angle a. A housing 153 of ion beam 158 is grounded at $GR_0$. An object $OB_0$ to be treated, is installed inside housing 152 above target 160, so that its surface could be treated with magnetron plasma. The function of an anode is fulfilled by aforementioned grounded housing 153 of ion-beam source 158. Target 160 of magnetron 154 is connected, via magnetron body, to a negative terminal 157a of a direct-current voltage source 157. A positive terminal 157b of voltage source 157 is grounded. A working medium is supplied into housing 152 via a gas supply port 161. All other systems of electric, gas, vacuum, and cooling liquid supply are not shown and are similar to those used in conventional ion-beam sources and magnetron, which have been partially described earlier and will be partially described further in connection with specific embodiments of the invention. Ion source 158 may be of any type suitable for emitting an ion beam onto the target at an oblique angle. The above description is general to show main components of the apparatus of the invention. The invention will be further described in more detail with reference to specific embodiments.

Figure 5A:
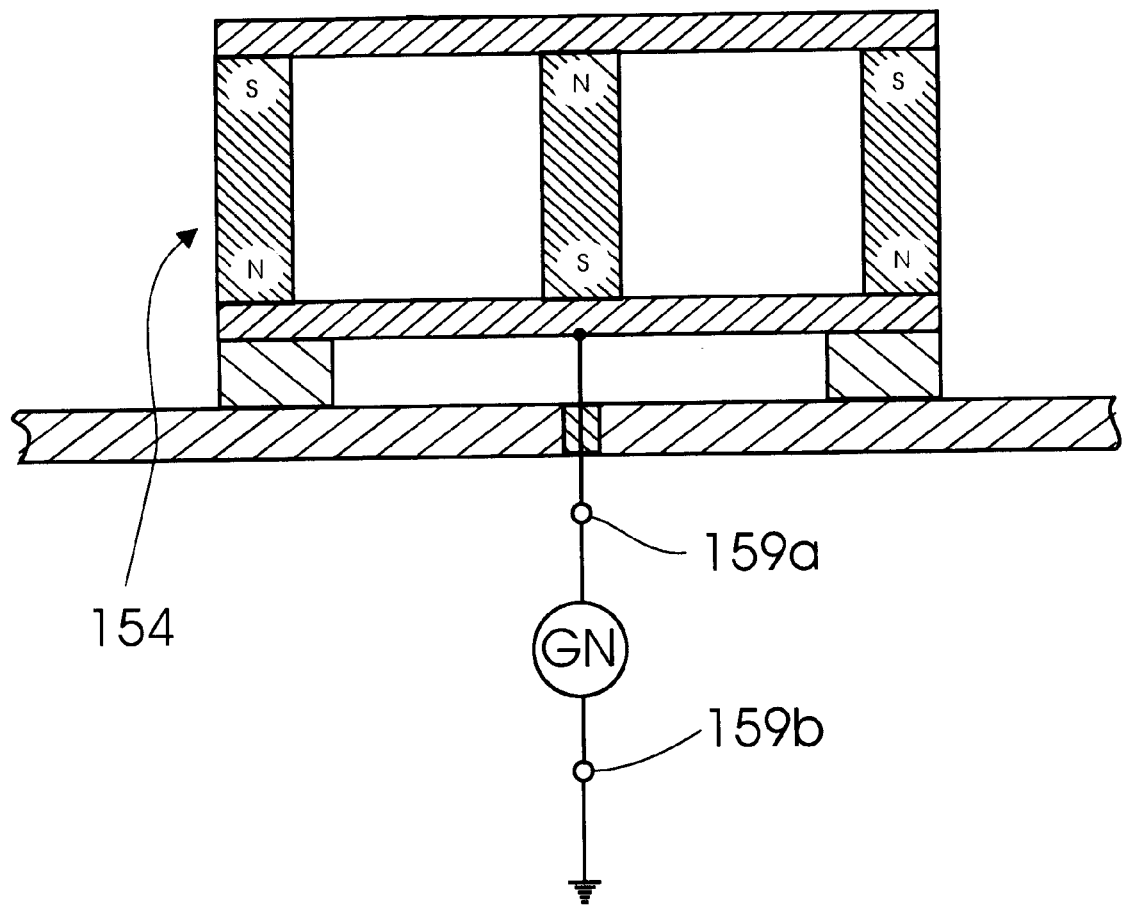
FIG. 5A is a partial sectional view that shows connection of an RF magnetron to a high-frequency generator.

Magnetron 154 can be an RF-type magnetron. In this case, as shown FIG. 5A, which is a partial sectional view that shows connection of an RF magnetron to a high-frequency generator, D.C. voltage source 157 is replaced by a high-frequency generator GN. More specifically, a generator terminal 159a is connected to the sputterable target, and a generator terminal 159b is grounded.

Figure 5B:
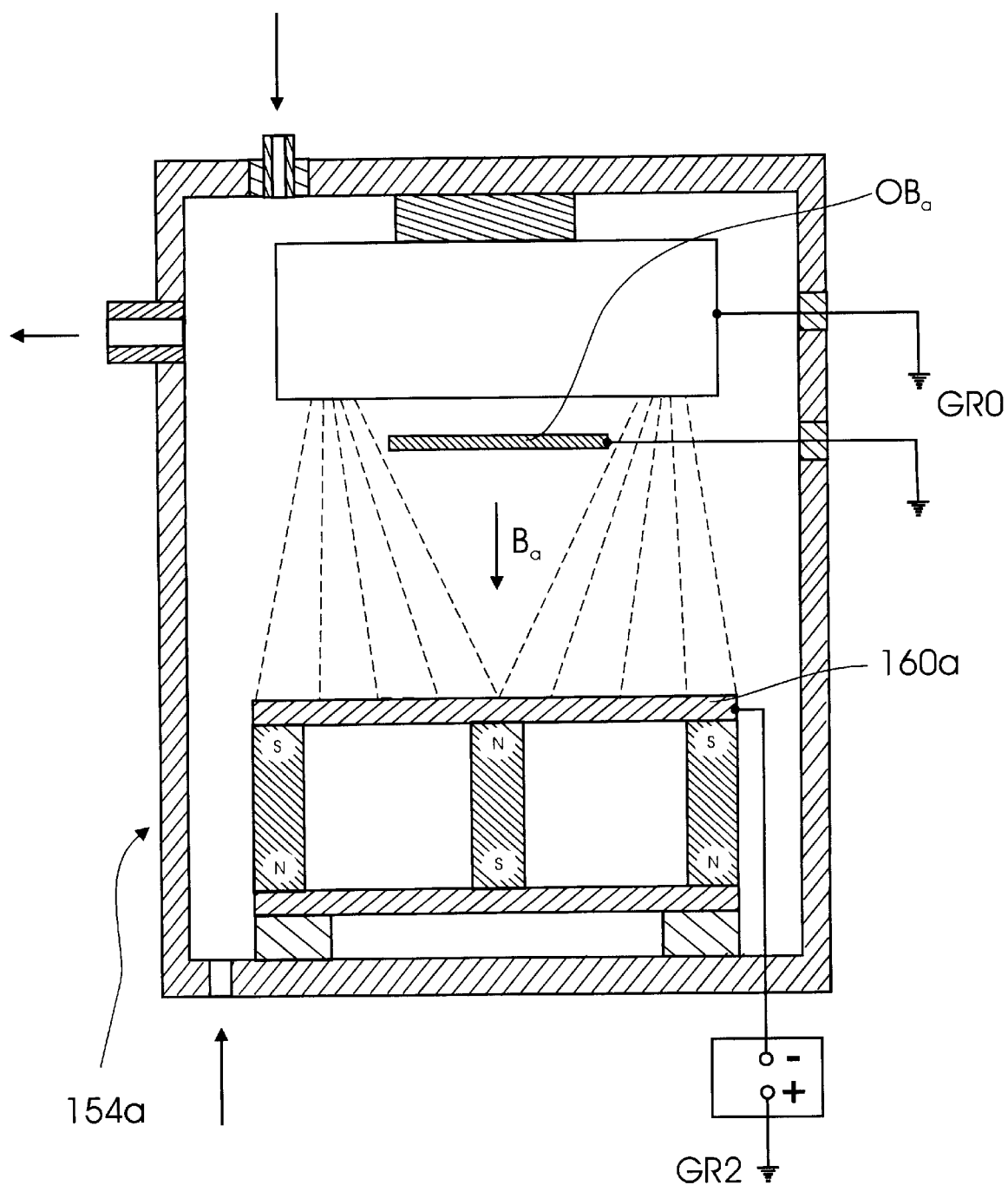
FIG. 5B is a schematic sectional view of a combined ion-beam source and sputtering magnetron apparatus in accordance with the invention where the ion beam is perpendicular to the magnetron surface.

FIG. 5B shows a configuration of a combined ion-beam source and magnetron apparatus 154a in which an ion source emits an ion beam onto a target 160a in the direction of arrow $B_a$ which is perpendicular to the surface of target 160a. Apparatus 154a also will operate in accordance with the invention, since the beam bombards target 160a and thus sputters its material and applies it onto an object $OB_a$ via a plasma (not shown). However, the embodiment with an oblique angle is preferable because in the case of an oblique angle the coefficient of sputtering S is significantly higher that in the case of the beam incidence perpendicular to the object. Therefore all the embodiments will be shown and described below with reference to the oblique angle.

Figure 6:
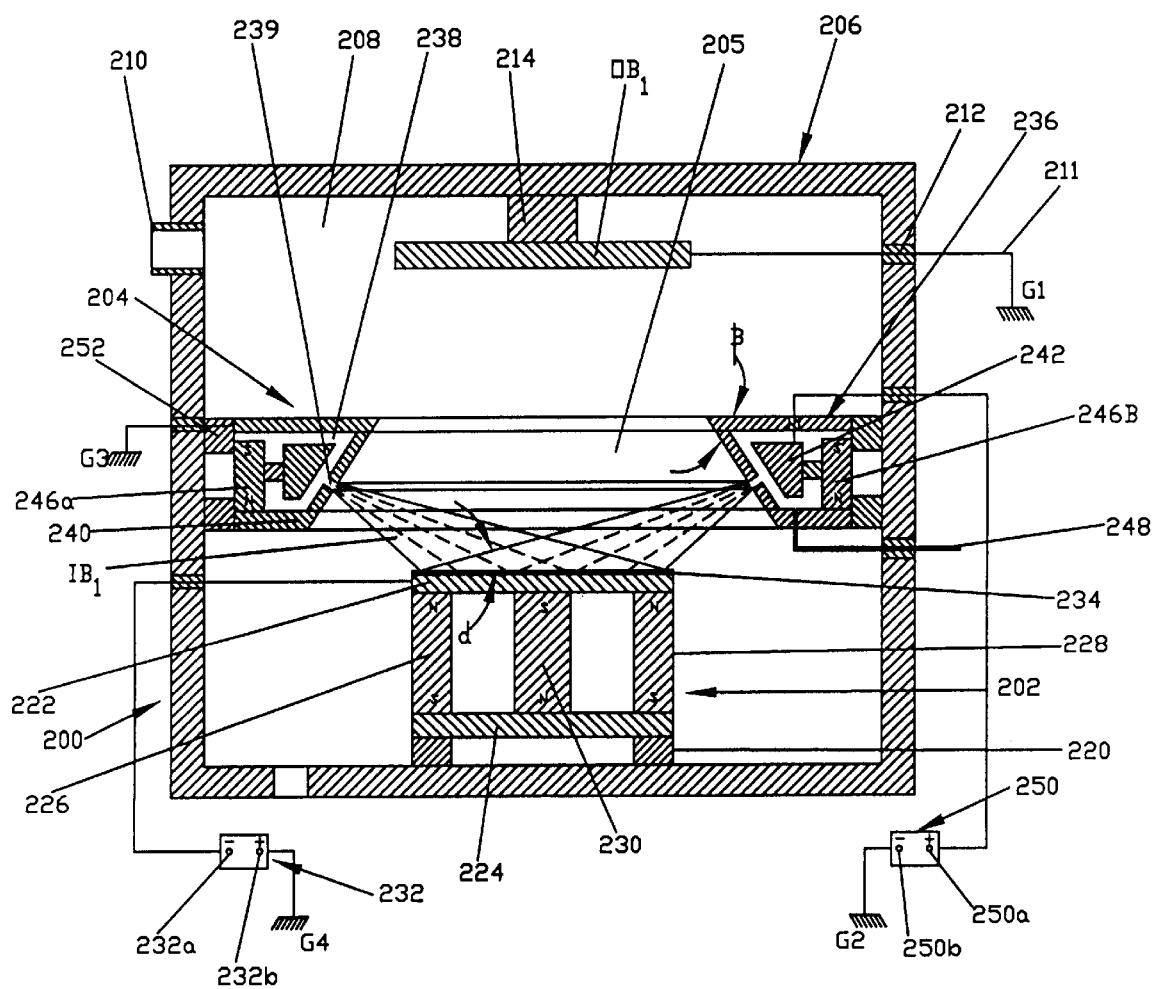
FIG. 6 is a schematic sectional view of a combined sputtering magnetron and ion-beam source apparatus with the emission of an ion beam radially inwardly toward the magnetron target.

FIG. 6 is a general schematic sectional view of the combined apparatus 200 of the invention which consists of a magnetron 202 and an ion-beam source 204 fixed inside a housing 206. Housing 206 defines a sealed vacuum chamber 208 that is connected to a vacuum pump (not shown) via a tube 210. Fixed inside housing 206 is an object $OB_1$ which is grounded. If housing 206 is made of an nonconductive, e.g., dilelectric material, such as ceramic, object $OB_1$ should be grounded at $G_1$, e.g., via a conductor 211 that passes through the wall of housing 206 via a conventional electric feedthrough 212. Object $OB_1$ can be attached to housing 206, e.g., by a mounting block 214. If housing 206 is made of a conductive material, object $OB_1$ can be grounded via a metal bolt (not shown) and housing 206 itself. If necessary, object $OB_1$ can be isolated from the ground.

Magnetron 202 is supported in housing 206 by means of a mounting block 220, e.g., of a dielectric material. It is arranged opposite the surface of objet $OB_1$ to be treated.

Magnetron consists of a cathode plate 222, a magneto-conductive plate 224, and a group of permanent magnets arranged over the periphery of magnetron between plates 222 and 224. If magnetron has a round transverse cross section, a plurality of magnets are arranged circumferentially along the periphery of the round magnetron. Only two magnets 226 and 228 of this plurality are shown in FIG. 6. A central magnet 230 is located in the center of cylindrical magnetron 202. In peripheral magnets north poles N are in contact with cathode plate 222, and south pole S are in contact with plate 224. In central magnet 230, the orientation of magnetic poles is opposite.

Cathode plate 222 of magnetron 202 is connected to a negative terminal 232a of a D.C. voltage power source 232 and is maintained under a potential highly negative with respect to the ground, e.g., −500V. A positive terminal 232b of D.C. voltage source 232 is grounded at $G_2$. A target 234 of a sputterable material such as aluminum, silicon, chromium, quartz, etc. is tightly connected to cathode plate 222, e.g., by bolts (not shown).

An ion source 204 may be of any type suitable for bombarding the surface of target 234 at an oblique angle to the target surface, i.e., at an angle different from 90°. The most advantageous for the purpose of the invention, however, is a so-called cold-cathode ion-beam source with electrons drifting in crossed electric and magnetic fields and with an inward-radial direction of the ion beam propagation. An ion-beam source 204 has a closed-loop shape, e.g & circular, oval, elliptical, or the like, and has an opening 205 for exposing object $OB_1$ to the sputterable surface of target 234. Such an ion source is described in U.S. patent application Ser. No. 161,581 field on Sep. 28, 1998 now U.S. Pat. No. 6,130,507. Ion beam source 204 used in apparatus 200 differs from the one described in the aforementioned patent application in that it emits the ion beam in inward radial direction at an oblique angle to the surface of target 234. It is an essential feature of the present invention, since, it has been found that the bombardment of the target surface by an ion beam at an oblique angle to the target surface significantly improves the efficiency of operation of magnetron due to an increase coefficient S of sputtering.

More specifically, an ion-beam source 204 has a hollow annular-shaped housing 236 which defines a working vacuum chamber 238. Housing 236 is grounded at $G_3$ and defines a cathode assembly with a closed-loop ion-emitting slit 239 on a tapered inner wall 240 of cathode or housing 236. Inner wall 240 converges in the upward direction, i.e., toward object $OB_1$ so as to emit the ion beam obliquely and radially downwardly toward the surface of target 234 at an angle a toward the surface of the target. More specifically, inner wall 240 of annular cathode 204 forms with a top flat surface 241 of housing-cathode an acute angle β, e.g., within the range of 10° to 70°, which is equal to aforementioned angle α.

Located and fixed inside hollow annular housing-cathode 236 is a ring-shaped anode 242. The surface of anode 242 nearest to ion-emitting slit 239 is tapered and is parallel to the inner surface of cathode 236. An outer wall 244 of annular cathode 236 is formed by a set of permanent rod-like magnet 246a and 246b (although only two magnets are shown, it is understood that a plurality of circumferentially arranged magnets are used). Working chamber 238 of hollow cathode 236 is connected to s source of a working gas supply (not shown) via a working gas supply tube 248. The working gas is evacuated via aforementioned tube 210.

Anode 242 of ion source 204 is connected to a positive terminal 250a of a D.C. voltage power supply source 250. A negative terminal 250b of power source 250 is grounded at $G_4$.

Ion source 204 is fixed in housing 206 by means of a ring-shaped support 252.

Combined ion source and sputtering magnetron 200 of FIG. 6 operates as follows:

Working chamber 238 of ion source 204 is evacuated to a pressure within the range of $1 \times 10^{-5}$ Torr to $1 \times 10^{-3}$ Torr, and a working gas, such as argon, is fed to working chamber 238 of ion source 204 via working gas supply tube 248. A positive voltage of 200 V to 5 kV is applied to anode 242. A magnetic field is generated by magnet 246 in the accelerating gap between anode 246 and cathode plate 222, whereby electrons begin to drift in a closed path within the crossed electrical and magnetic fields. A plasma (not shown) is formed between anode 246 and cathode plate 222. When the working gas is at passed through the ionization gap, tubular ion beam $IB_1$ is emitted toward sputterable target 234 radially inwardly in the direction of an arrow C at an oblique angle GE toward the surface of sputterable target 234 though ion-emitting slit. Ion beam $IB_1$ begins to bombard target 234, sputters the target material, and knocks-out secondary electrons from target 234. As a result, a large amount of electrons is formed. These electrons are held in crossed electric and magnetic fields and ionize molecules of the working gas, whereby a plasma 256 is formed. Since target plate 234 has a potential highly negative with respect to the positively charged plasma, the ions are extracted from the plasma by the negative potential of the target and bombard target 234, thus causing formation of sputtered particles. These particles reach the surface of object $OB_1$ and form a coating film on its surface.

After plasma 256 has been ignited, ion source 204 can be switched off, and plasma 256 will be maintained purely due to the magnetron effect with operation of the apparatus in a steady mode. In other words, apparatus 200 of the embodiment of FIG. 6 operates in two modes: a plasma ignition mode and a steady mode with ion source 204 being switched off.

Since the surface of sputterable target plate 234 is constantly bombarded by ion beam $IB_1$, the formation of a dielectric films during reactive sputtering is prevented, and the treated surface is not contaminated.

Figure 7:
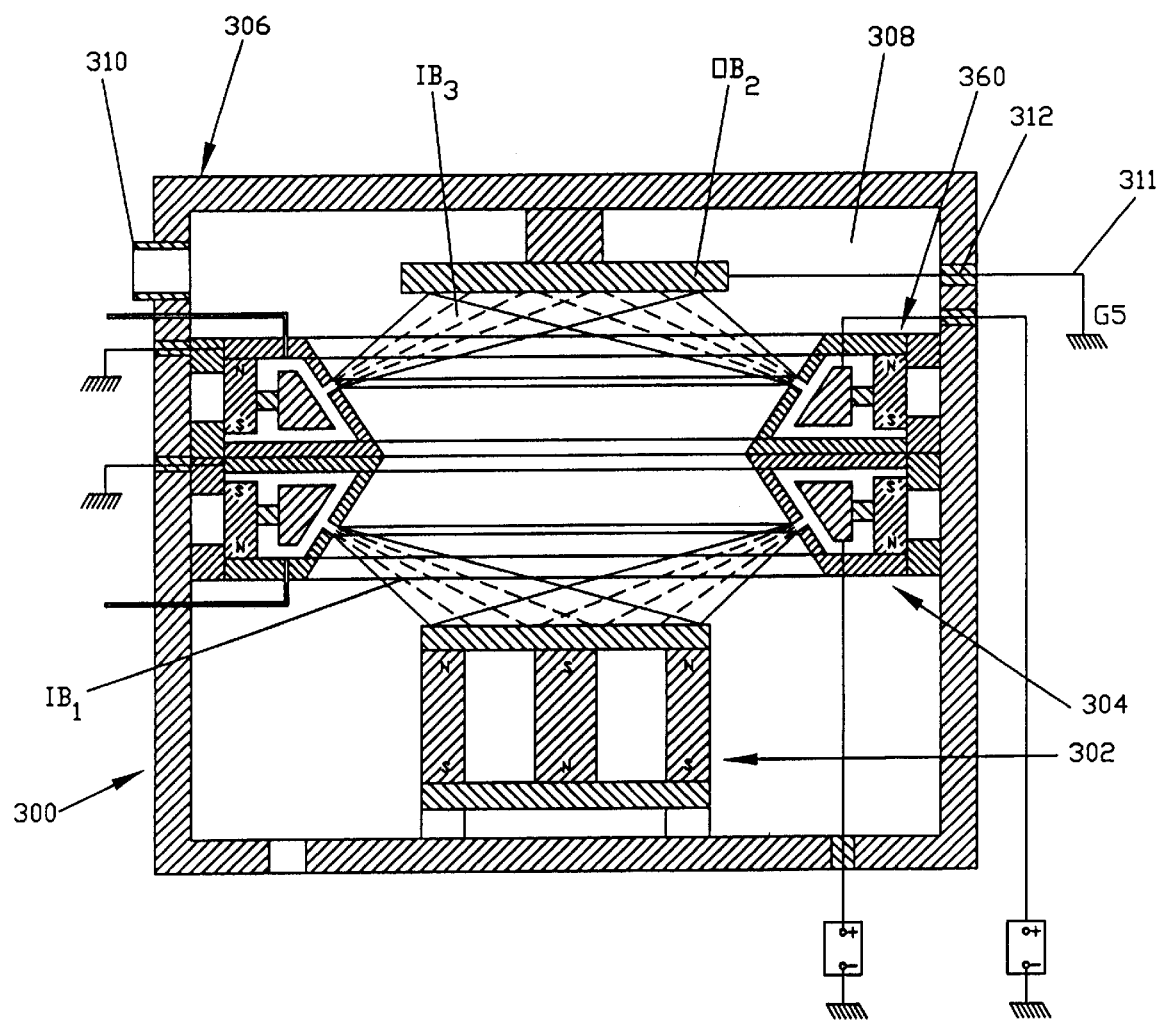
FIG. 7 is a view similar to FIG. 4 illustrating the apparatus in accordance with an embodiment of the invention which allows overcoating simultaneously with ion-assisted film-growing control treatment.

FIG. 7 is a view similar to FIG. 6 illustrating the apparatus in accordance with the second embodiment of the invention which allows pretreatment of the object surface and control =of the overcoating process.

Since the apparatus of this embodiment is similar to the one shown in FIG. 6, those parts and units of the embodiment of FIG. 7 which have been shown and described earlier will be designated by the same reference numerals with an addition of 100 and their description will be omitted. For example, an apparatus 300 of the embodiment of FIG. 7 consists of a magnetron 302 and an ion-beam source 304 fixed inside a housing 306. Housing 306 defines a sealed vacuum chamber 308 that is connected to a vacuum pump (not shown) via a tube 310. Fixed inside housing 306 is an object $OB_2$ which is grounded or isolated from the ground. If housing 306 is made of an nonconductive, e.g., dielectric material, such as ceramic, object $OB_1$ should be grounded at $G_5$, e.g., via a conductor 311 that passes through the wall of housing 306 via a conventional electric feedthrough 312, etc.

The apparatus of FIG. 7 differs from the apparatus of FIG. 6 by having an additional or a second ion-beam source 360 which is located between ion-beam source 304 and object $OB_2$ and which emits an ion beam $IB_3$ toward object $OB_2$ at an oblique angle β, i.e., at angle different from 90° to the surface of the object. Ion source 360 may be identical to ion source 306 and may be arranged symmetrically oppositely thereto, as shown in FIG. 7. If necessary, however, ion source 360 may be different from ion source 304 and even be of a different type and with different working characteristics. For the sake of convenience, however, it shown similar to ion source 304 with an ion beam $IB_3$ emitted radially upwardly and obliquely to the surface of object $OB_2$. Ion source 360 has a cathode 362 with an ion-emitting slit 364. An annular anode 366 is tapered and diverges upwardly, in order to emit ion beam $IB_3$ via ion-emitting slit 364 onto the surface of object $OB_2$. Ion source 360 has electrical and gas-supply connections (not shown) which are similar to those of the apparatus of FIG. 6.

Apparatus 300 of the invention operates in the same manner as apparatus 200 of FIG. 6 with the difference that ion source 360 can operate individually or simultaneously with the main source 304 for pretreating or for enhancing the overcoating procedure. Each source may operate with different working media. For example, in synthesis of high-temperature superconductive films with the use of magnetron ot ion-beam sputtering, the working medium has a tendency to a decrease in the contents of oxygen. This leads to significant impairment in the properties of the superconductive films. To compensate for such oxygen depletion, during magnetron sputtering and ion-beam treatment with magnetron 302 and ion source 304, the surface of object $OB_2$ can be treated with oxygen-dozed beam IB3 emitted from ion-beam source 360. The same approach can be employed in the formation of silicon-oxide films with the use of RF magnetrons with electrical connections shown in FIG. 5A. It is understood that the apparatus 306 allows any combinations of operation modes and working media with the use of two ion-beam sources 304 and 360. Such a possibility imparts to apparatus 306 high versatility. Ion-beam source 360 can be used independently prior to operation of ion source 304, e.g., for cleaning, etching, or activating the surface of object $OB_2$.

Figure 8:
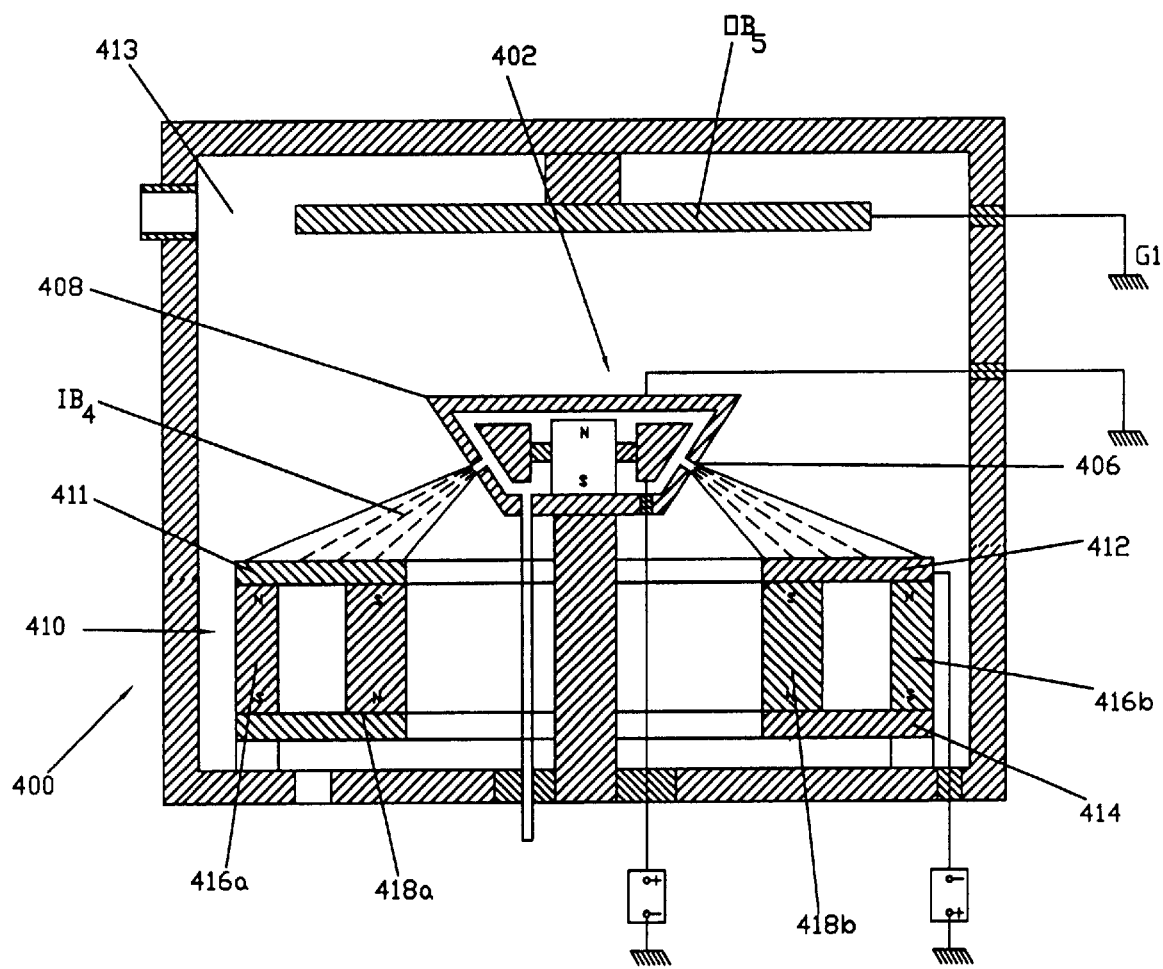
FIG. 8 is a schematic sectional view of a combined sputtering magnetron and ion-beam source apparatus with the emission of an ion beam radially outwardly toward the annular magnetron target.

FIG. 8 is a partial schematic sectional view of a combined sputtering magnetron and ion-beam source apparatus 400 with the emission of an ion beam $IB_4$ from an ion-beam source 402 radially outwardly toward an annular magnetron target 404. This apparatus differs from apparatus 306 of FIG. 7 only by the construction of an ion-beam source 402. More specifically, ion-beam source 402 has an ion-emitting slit 406 on the outer side of the source. An outer surface 408 of ion source 402 is tapered in the direction opposite to that of ion source 204, i.e., it diverges toward an object $OB_5$. As a result, ion beam $IB_4$ is emitted radially outwardly in the downward direction onto an annular target-sputtering magnetron 410. This magnetron should have transverse dimensions greater than the transverse dimensions of ion source 402 and may be of a ring-shaped configuration, since only peripheral parts of the target are used. More specifically, magnetron 410 consists of a cathode plate 411, a sputterable target 412 attached to cathode plate 411, a magnetoconductive plate 414, and two concentric rows of permanent magnets. Only two magnets are shown in each row, i.e., magnets 416a and 416b belong to the outer row, and magnets 418a and 418b belong to the inner row. The magnetic poles in one row of magnets have orientation opposite to magnetic poles in the other row of magnets. The oblique angle α of beam $IB_4$ with respect to target 402 may be the same as described above in connection with the previous embodiments of the invention. The working medium supply and electrical connections are the same in the previous embodiments and therefore are not designated.

When ion beam $IB_4$ bombards the surface of ring-shaped sputterable target 412, a plasma 413 is formed in a process which has been described in detail above, and sputterable particles of the target material are deposited onto an object $OB_4$.

Figure 9:
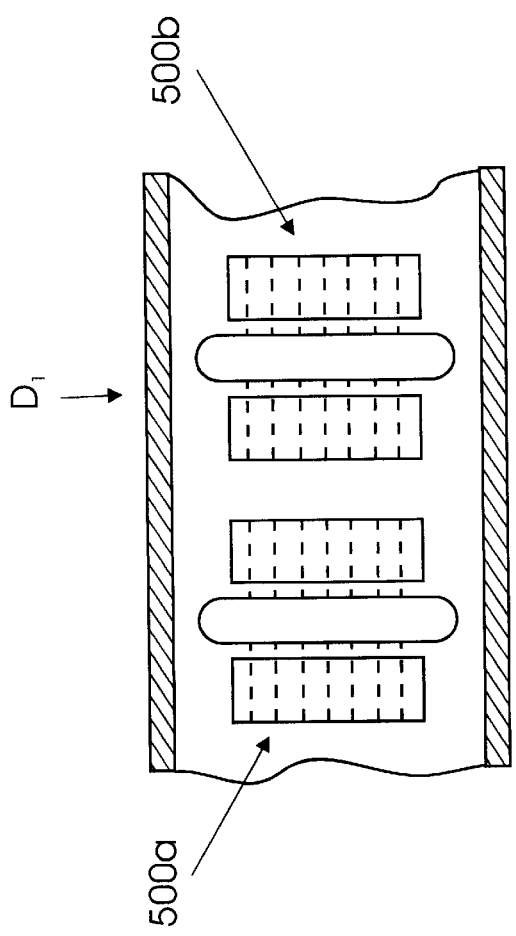
FIG. 9 is a plan view on a plurality of apparatuses of the invention installed in series on a conveyor line.

FIG. 9 is a plan view on a plurality of apparatuses 500a, 500b . . . of the invention installed in series on a conveyor line 502, e.g., with computer hard-drive disks 504a, 504b . . . 504n. In the illustrated example, apparatuses 500a, 500b, etc. are used, e.g., for application of a chromium layer, a magnetic layer, and a carbon layer sequentially onto the surfaces of disks 504a, 504b . . . 504n.

Figure 10:
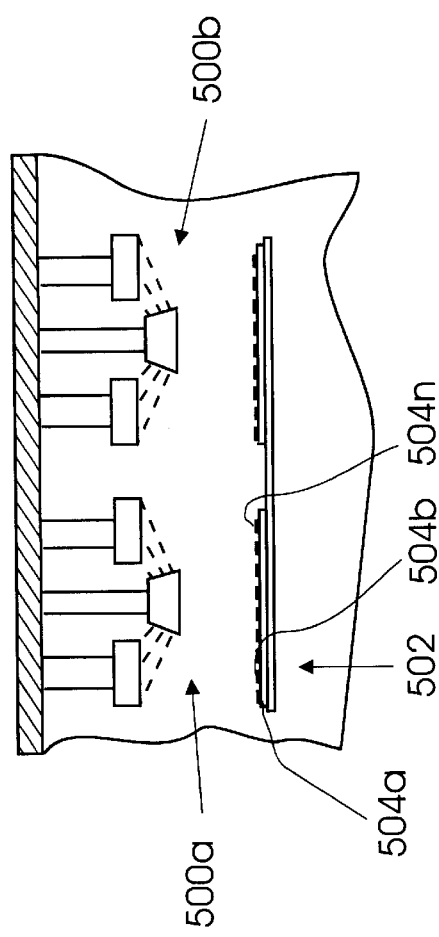
FIG. 10 is a view in the direction of arrow D in FIG. 9.

FIG. 10 is a view in the direction of arrow D in FIG. 9.

As can be seen from FIGS. 9 and 10, each apparatus has a single ion source 506 working in conjunction with two target sputtering magnetron 508, 510. Since all apparatuses are identical, the component parts are designated only in apparatus 500a. Since ion source 506 operates with two sputtering magnetrons 508 and 510, it is advantageous to use an ion source with a closed-loop ion-emitting slit (not shown) and with the drift of electrons in crossed electric and magnetic fields. Each such ion source may be of the same type as ion source 402 shown in FIG. 8. It is obvious for those skilled in the art that conveyor 502 with objects being treated, as well as apparatuses 500a, 500b, . . . are located in system of closed vacuum chambers with lock-in and lock-out gates, etc.

Thus it has been shown that the combined ion-source and sputtering magnetron apparatus of the invention is highly efficient in operation, simple in construction, allows sputtering of both conductive and nonconductive materials, provides activation, etching, cleaning or similar preparatory treatment of an object prior to and during overcoating, makes it possible to reduce pressed in the working chamber, generates high vacuum in the working chamber, operates in conjunction with both D.C and RF magnetrons, makes it possible to decrease a magnetron discharge voltage and the discharge ignition voltage. The invention also provides a method for sputtering conductive and nonconductive materials with the use of a combined ion-source and sputtering magnetron apparatus.

Although the invention has been shown and described with reference to specific embodiments, it is understood that these embodiments were given only as examples and that any changes and modifications are possible, provided they do not depart from the scope of the appended claims. For example, ion source 158 of FIG. 5 can be a Kaufman ion source with ion-optical system in the form of grids, a Hall-end gridless-type ion source, etc. The targets can be made of a conductive, non-conductive materials, composite materials, magnetic materials, high-temperature superconductive materials, etc. The targets can be cooled or work without cooling. The magnetron may have a rectangular, round, oval, prismatic, or a ring-shaped, or any other configuration. The same or various working media can be supplied into the system sequentially or simultaneously directly into the housing of the vacuum chamber (as in conventional sputtering magnetrons), into one or two ion-beam sources and then to the housing of the apparatus.

What is claimed is:

1. A combined ion-source and target-sputtering magnetron apparatus, comprising:

a sealed housing forming a vacuum chamber connected to a source of vacuum;

at least one object to be treated located in said sealed housing;

at least one target-sputtering magnetron located in said housing and having a target with sputterable surface opposite said at least one object; and at least one ion-beam source located in said housing and directing an ion beam onto said sputterable surface of said target-sputtering magnetron for producing sputtered particles, said ion beam falling onto said sputterable surface at an angle from 0 to 90° to said surface, said at least one ion-beam source being a cold-cathode ion-beam source with drift to electrons in crossed electric and magnetic fields, said ion-beam source having a housing, an anode and a cathode located in said housing of said ion-beam source, a working medium supply means for supplying at least one working medium into said housing of said ion-beam source, said apparatus having a first direct current voltage source with a first positive-voltage terminal and a first negative-voltage terminal, said ion-beam source having a housing which is connected grounded, said first positive-voltage terminal being connected to said anode, and said first negative-voltage terminal being ground, said ion-beam source having an opening for exposing said at least one object to said sputterable surface and having a closed-loop configuration with an outer side and inner side, said inner side being tapered and diverges toward said sputterable surface, said inner side having a closed-loop ion-emmitting slit through which said ion beam is emitted an angel from 0 to 90° onto said sputterable surface.

2. The apparatus of claim 1, further comprising a second direct current voltage source having a positive terminal and a negative terminal, said positive terminal being grounded, and said negative terminal being connected to said sputterable surface of said target-sputtering magnetron.

3. The apparatus of claim 1, further comprising a high-frequency voltage source having a first terminal connected to said target and a second terminal which is grounded.

4. The apparatus of claim 1, further comprising a second ion-beam source having means for emitting an ion beam onto said object.

5. The apparatus of claim 4, where said second ion-beam source comprises a housing, an anode and a cathode located in said housing of said second ion-beam source, a working medium supply means for supplying a working medium into said housing of said second ion-beam source.

6. The apparatus of claim 5, further comprising a second direct current voltage source having a second positive terminal and a second negative terminal, said first positive terminal being grounded, and said second negative terminal being connected to said target.

7. The apparatus of claim 5, further comprising a second high-frequency voltage source having a first terminal connected to said target and a second terminal which is grounded.

8. The apparatus of claim 1, comprising a plurality of combinations of said at least one ion-beam source with said at least one magnetron, said combinations being arranged in series, a plurality of said objects, means for supporting said objects and for moving said objects sequentially along said magnetrons of said plurality for exposing said objects to a flow of said sputtered particles emitted from said magnetrons.

9. The apparatus of claim 8, wherein in each said combination said at least one ion-beam source is a cold-cathode ion-beam source with drift of electrons in crossed electric and magnetic fields, said at least one ion-beam source having a housing, an anode and a cathode located in said housing of said at least ion-beam source, a working medium supply means for supplying at least one working medium into said housing of said at least one ion-beam source, said apparatus having a first direct current voltage source with a positive-voltage terminal and a negative-voltage terminal, said at least one ion-beam source having a housing which is grounded, said positive-voltage terminal being connected to said anode, and said negative-voltage terminal being grounded.

10. The apparatus of claim 9, wherein said ion-beam has an opening for exposing said at least one object to said sputterable surface and has a closed-loop configuration with an outer side and inner side, said inner side being tapered and diverge toward said sputterable surface, said inner side having a closed-loop ion-emitting slit through which said ion beam is emitted at an angle from 0 to 90° onto said sputterable surface.

11. The apparatus of claim 10, where further comprising a second direct current voltage source having a second positive terminal and a second negative terminal, said first positive terminal being grounded, and said second negative terminal being connected to said sputterable target.

12. The apparatus of claim 10, further comprising a second high-frequency voltage source having a first terminal connected to said sputterable target and a second terminal which is grounded.

13. The apparatus of claim 10, further comprising a second ion-beam source having means for emitting an ion beam onto said object.

14. The apparatus of claim 13, wherein said second ion-beam source has a housing, an anode and a cathode located in said housing of said second ion-beam source, and a working medium supply means for supplying a working medium into said housing of said second ion-beam source.

15. The apparatus of claim 14, further comprising a second direct current voltage source having a second positive terminal and a second negative terminal, said first positive terminal being grounded, and said second negative terminal being connected to said sputterable target.

16. The apparatus of claim 14, further comprising a second high-frequency voltage source having a first terminal connected to said sputterable target and a second terminal which is grounded.

17. A combined ion-source and target-sputtering magnetron apparatus, comprising:

a sealed housing forming a vacuum chamber connected to a source of vacuum;

at least one object to be treated located in said sealed housing;

at least one target-sputtering magnetron located in said housing and having a target with sputterable surface opposite said at least one object; and at least one ion-beam source located in said housing and directing an ion beam onto said sputterable surface of said target-sputtering magnetron for producing sputtered particles, said ion beam falling onto said sputterable surface at an angle from 0 to 90° to said surface, said target-sputtering magnetron having transverse dimensions greater than transverse dimensions of said ion-beam source, said ion-beam source having a tapered outer surface which converges toward said magnetron, and an ion-beam emitting split on said tapered outer surface for emitting said ion beam in an outward downward direction toward the portion of said target which has transverse dimensions greater than said ion-beam source.

18. A combined ion-source and target-sputtering magnetron apparatus, comprising:

a sealed housing forming a vacuum chamber connected to source of vacuum;

at least one object to be treated located in said sealed housing;

at least one target-sputtering magnetron located in said housing and having a target with sputterable surface opposite said at least one object; and at least one ion-beam source located in said housing and directing an ion beam onto said sputterable surface of said target-sputtering magnetron for producing sputtered particles, said ion beam falling onto said sputterable surface at an angle from 0 to 90° to said surface; a plurality of combinations or said at least one ion-beam source with said at least one magnetron, said combinations being arranged in series, a plurality of said objects, means for supporting said objects and for moving said object sequentially along said magnetrons of said plurality for exposing said objects to a flow of said sputtered particles emitted from said magnetrons, in each said combination said at least one ion-beam source is a cold-cathode ion-beam source with drift electrons in crossed electric and magnetic fields, said at least one ion-beam source having a housing, an anode and a cathode located in said housing of said at least ion-beam source, a working medium supply means for supplying at least one working medium into said housing of said at least one ion-beam source, said apparatus having a first direct current voltage source with a positive-voltage terminal and a negative-voltage terminal, said at least one ion-beam source having a housing which is grounded, said positive-voltage terminal being connected to said anode, and said negative-voltage terminal being grounded, wherein said target-sputterable magnetron having transverse dimensions greater than transverse dimensions of said ion-beam source, said ion-beam source having a tapered outer surface which converges toward said magnetron, and an ion-beam emitting slit on said tapered outer surface for emitting said ion beam in an outward downward direction toward the portion of said target which has transverse dimensions greater than said ion-beam source.

* * * * *